(12) United States Patent
Taguchi et al.

(10) Patent No.: US 11,367,655 B2
(45) Date of Patent: Jun. 21, 2022

(54) FORMING OPENINGS AT INTERSECTION OF CUTTING LINES

(71) Applicant: HAMAMATSU PHOTONICS K.K., Hamamatsu (JP)

(72) Inventors: Tomoya Taguchi, Hamamatsu (JP); Takeshi Sakamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 105 days.

(21) Appl. No.: 16/605,878

(22) PCT Filed: Feb. 9, 2018

(86) PCT No.: PCT/JP2018/004716
§ 371 (c)(1),
(2) Date: Oct. 17, 2019

(87) PCT Pub. No.: WO2018/193693
PCT Pub. Date: Oct. 25, 2018

(65) Prior Publication Data
US 2021/0125868 A1     Apr. 29, 2021

(30) Foreign Application Priority Data
Apr. 18, 2017  (JP) .............................. JP2017-082256

(51) Int. Cl.
*H01L 21/78* (2006.01)
*H01L 21/268* (2006.01)
(Continued)

(52) U.S. Cl.
CPC .............. *H01L 21/78* (2013.01); *B23K 26/53* (2015.10); *H01L 21/268* (2013.01);
(Continued)

(58) Field of Classification Search
CPC ........................ H01L 21/78; B23K 26/50–55
See application file for complete search history.

(56) References Cited

U.S. PATENT DOCUMENTS

| | | | |
|---|---|---|---|
| 5,888,884 A | 3/1999 | Wojnarowski | |
| 2006/0073676 A1* | 4/2006 | Chen ....................... | H01L 21/78 438/460 |

(Continued)

FOREIGN PATENT DOCUMENTS

| | | |
|---|---|---|
| CN | 102403336 A | 4/2012 |
| JP | 2006-175520 A | 7/2006 |

(Continued)

OTHER PUBLICATIONS

International Preliminary Report on Patentability dated Oct. 31, 2019 for PCT/JP2018/004716.

*Primary Examiner* — Kevin Parendo
(74) *Attorney, Agent, or Firm* — Faegre Drinker Biddle & Reath LLP

(57) ABSTRACT

A chip production method includes a first step of setting a first cutting line and a second cutting line on a substrate including a plurality of functional elements, a second step of forming a mask on the substrate such that the functional elements are covered and an intersection region including an intersection of the first cutting line and the second cutting line is exposed, a third step of removing the intersection region from the substrate and forming a penetration hole by etching the substrate using the mask, a fourth step of forming a modified region in the substrate along the first cutting line, a fifth step of forming a modified region in the substrate along the second cutting line, and a sixth step of forming chips by cutting the substrate along the first cutting line and the second cutting line.

4 Claims, 15 Drawing Sheets

(51) Int. Cl.
  *H01L 21/3065* (2006.01)
  *H01L 21/308* (2006.01)
  *H01L 23/00* (2006.01)
  *B23K 26/53* (2014.01)
  *H01L 21/304* (2006.01)

(52) U.S. Cl.
  CPC .......... *H01L 21/304* (2013.01); *H01L 21/308* (2013.01); *H01L 21/3065* (2013.01); *H01L 21/3083* (2013.01); *H01L 23/564* (2013.01)

(56) References Cited

U.S. PATENT DOCUMENTS

| | | | | |
|---|---|---|---|---|
| 2008/0150087 | A1* | 6/2008 | Farooq | .............. H01L 21/67092 |
| | | | | 257/620 |
| 2009/0098712 | A1* | 4/2009 | Taguchi | .................. H01L 21/78 |
| | | | | 438/462 |
| 2010/0320574 | A1* | 12/2010 | Kim | ........................ H01L 21/78 |
| | | | | 257/618 |
| 2017/0232558 | A1* | 8/2017 | Kano | ................. B23K 26/0861 |
| | | | | 219/121.72 |
| 2018/0015569 | A1* | 1/2018 | Lin | ........................ B23K 26/53 |

FOREIGN PATENT DOCUMENTS

| | | |
|---|---|---|
| JP | 2006-263754 A | 10/2006 |
| JP | 2009-099681 A | 5/2009 |
| JP | 2009-135342 A | 6/2009 |
| JP | 2010-514223 A | 4/2010 |
| JP | 2011-041966 A | 3/2011 |
| JP | 2011-181909 A | 9/2011 |
| JP | 2012-028452 A | 2/2012 |
| JP | 2013-110210 A | 6/2013 |
| JP | 2016-201496 A | 12/2016 |
| TW | 200917354 A | 4/2009 |
| TW | 200919882 A | 5/2009 |
| TW | 201637188 A | 10/2016 |
| WO | WO-2008/079662 A1 | 7/2008 |

* cited by examiner

Fig.9
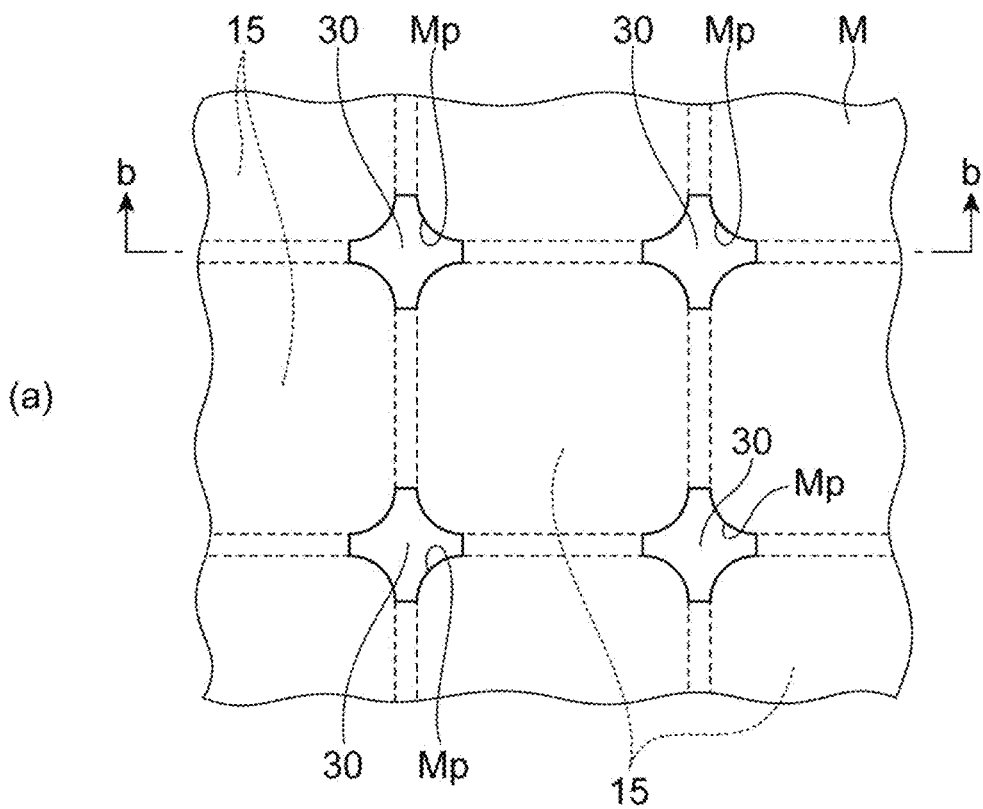
(a)
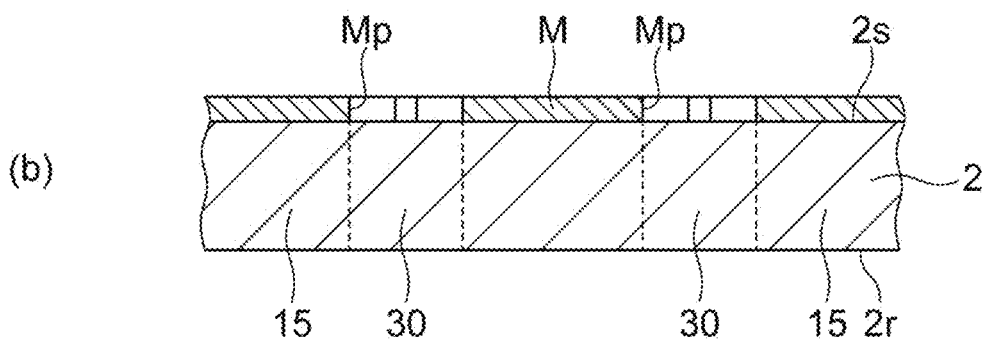
(b)

Fig.11
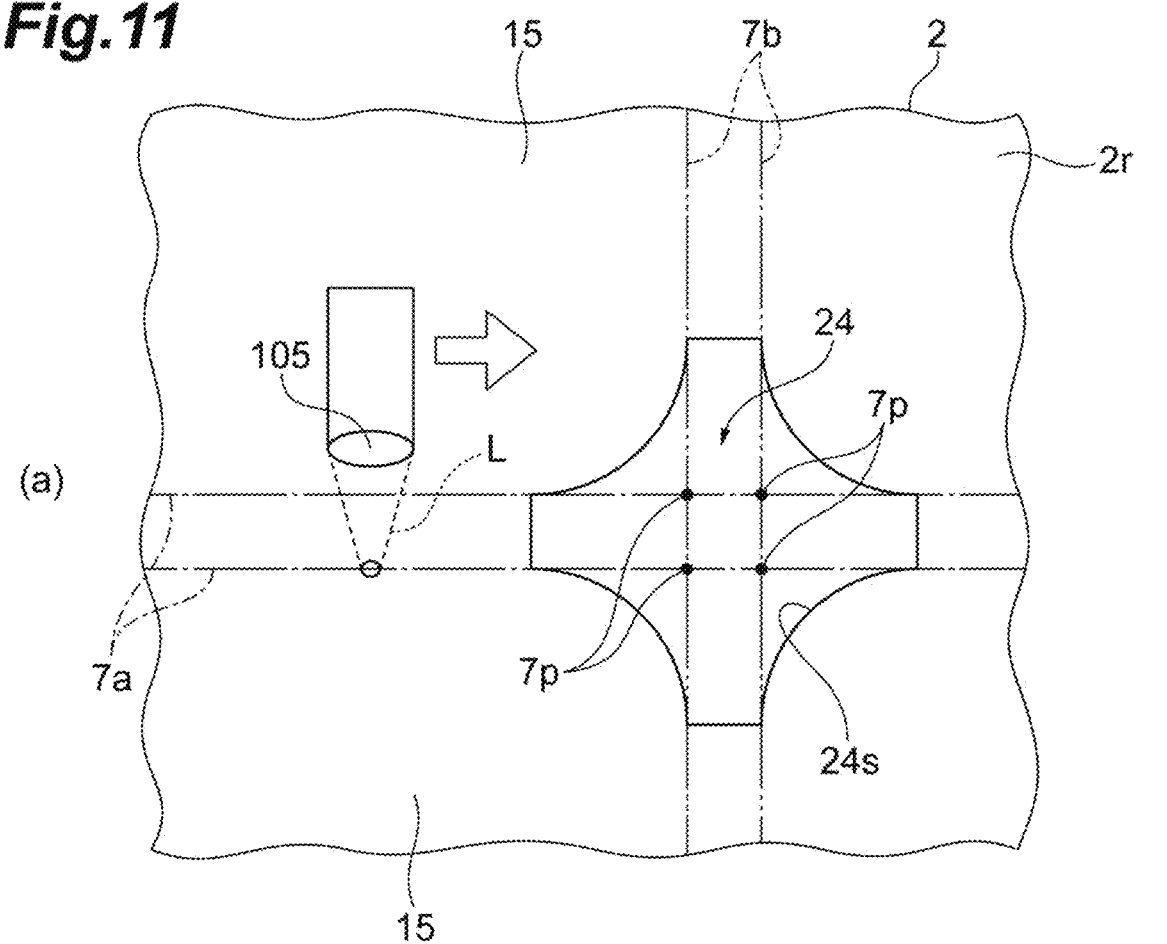
(a)
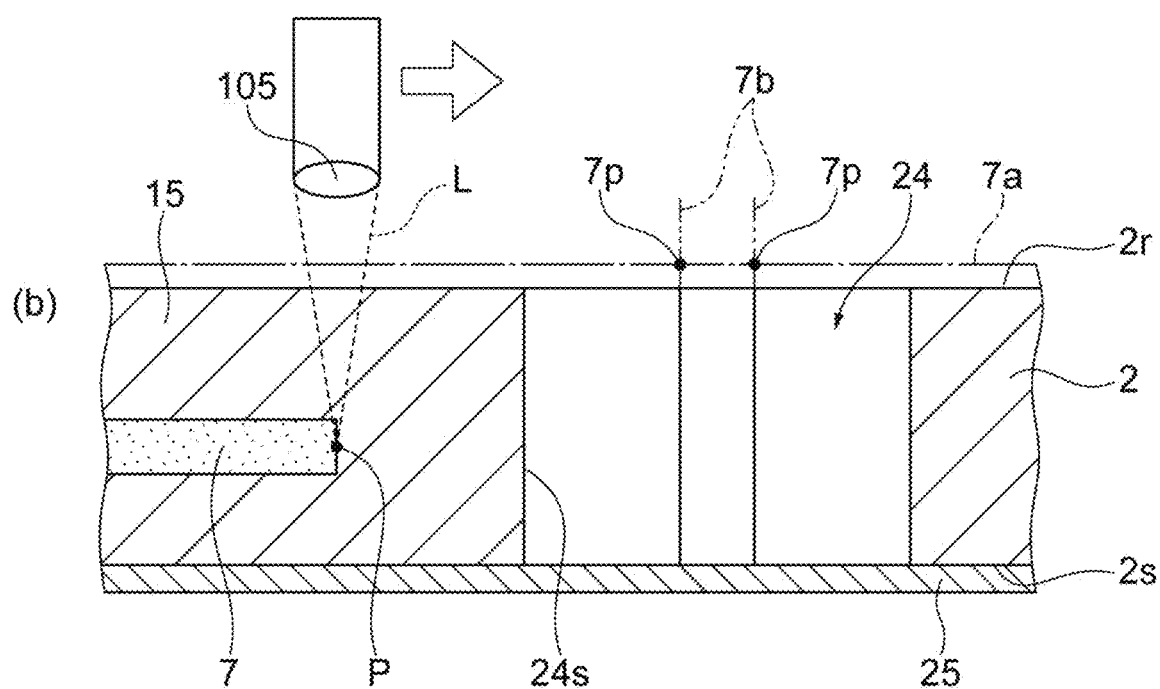
(b)

Fig.13
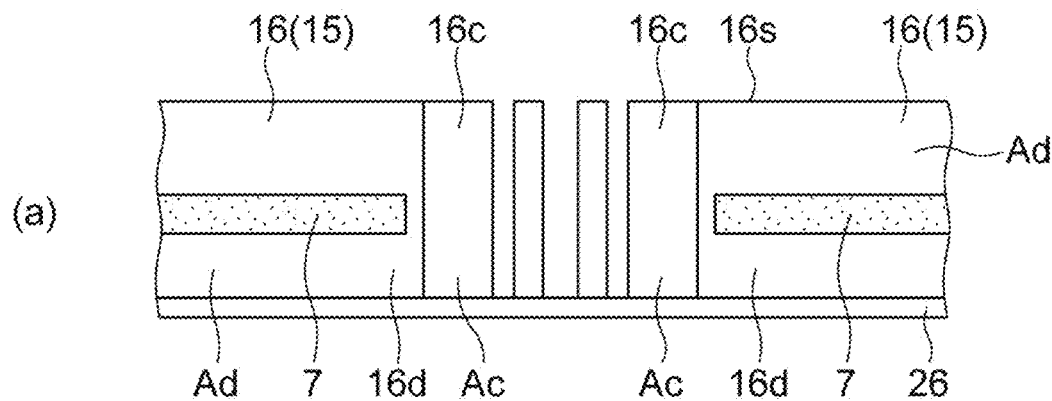
(a)
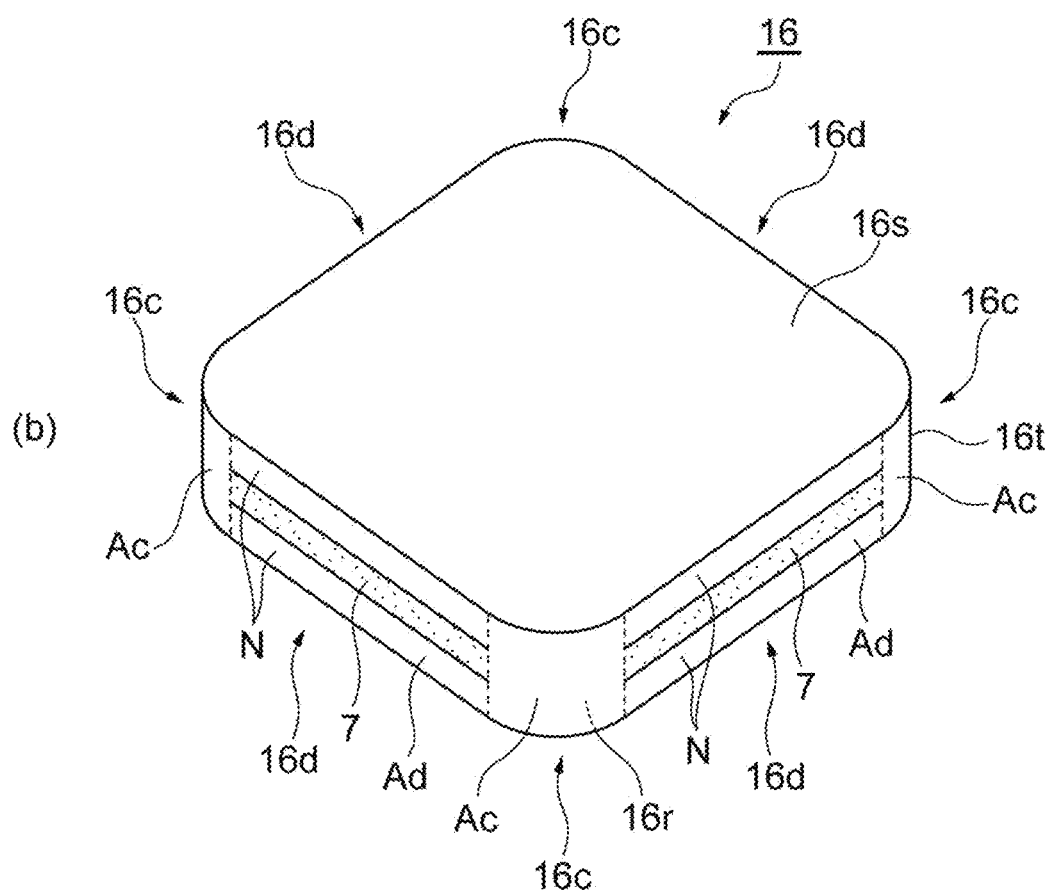
(b)

Fig.14
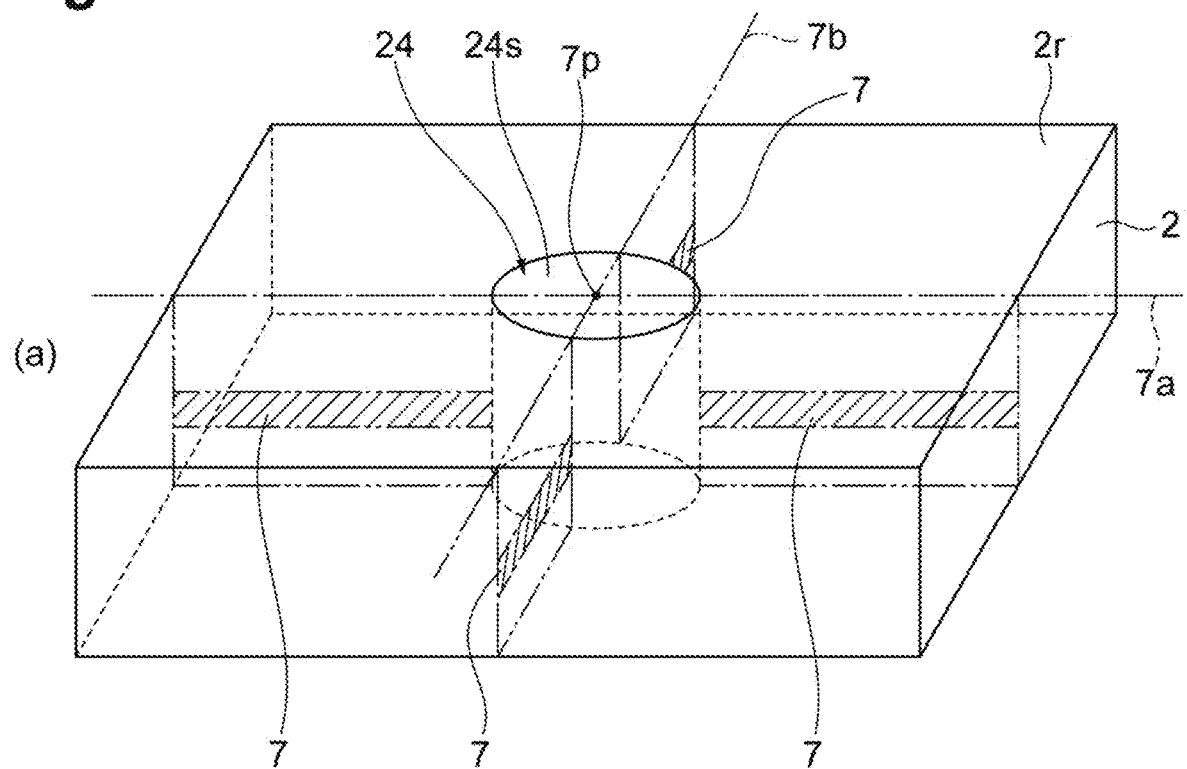
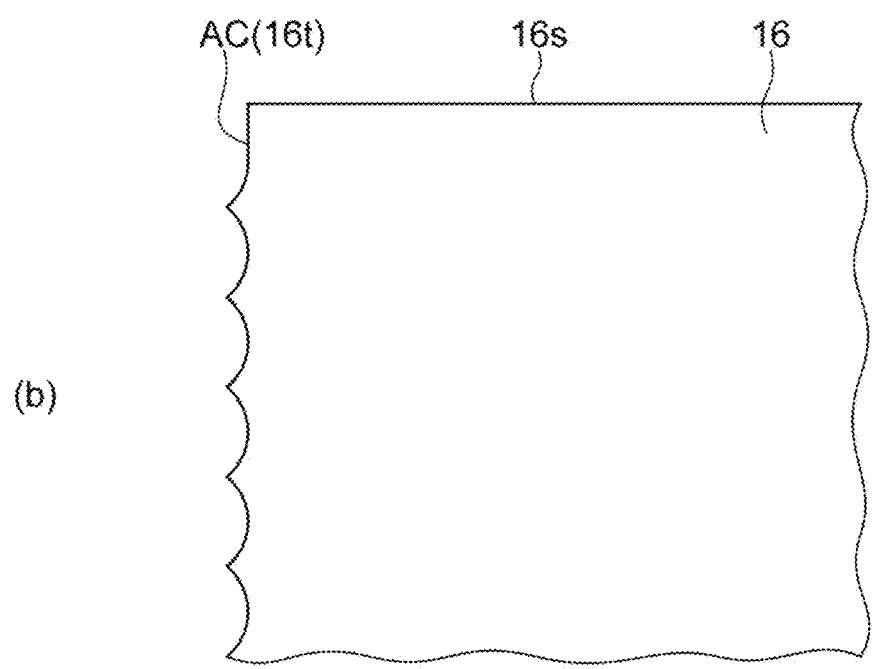

Fig.15
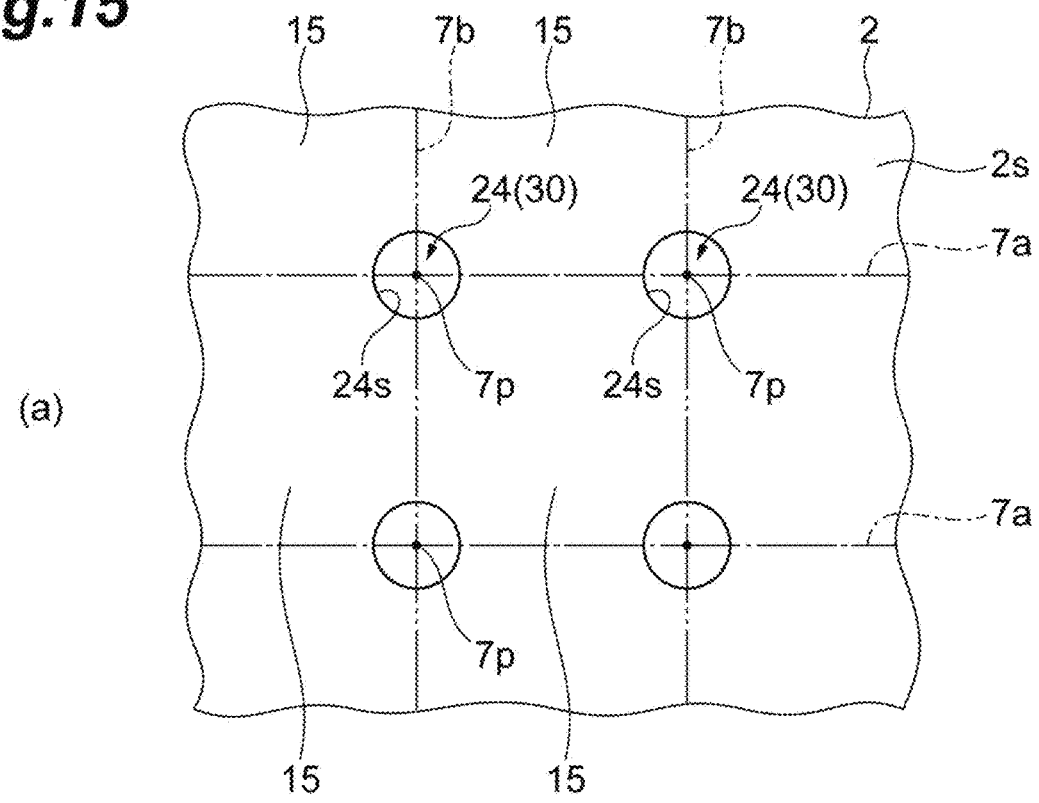
(a)
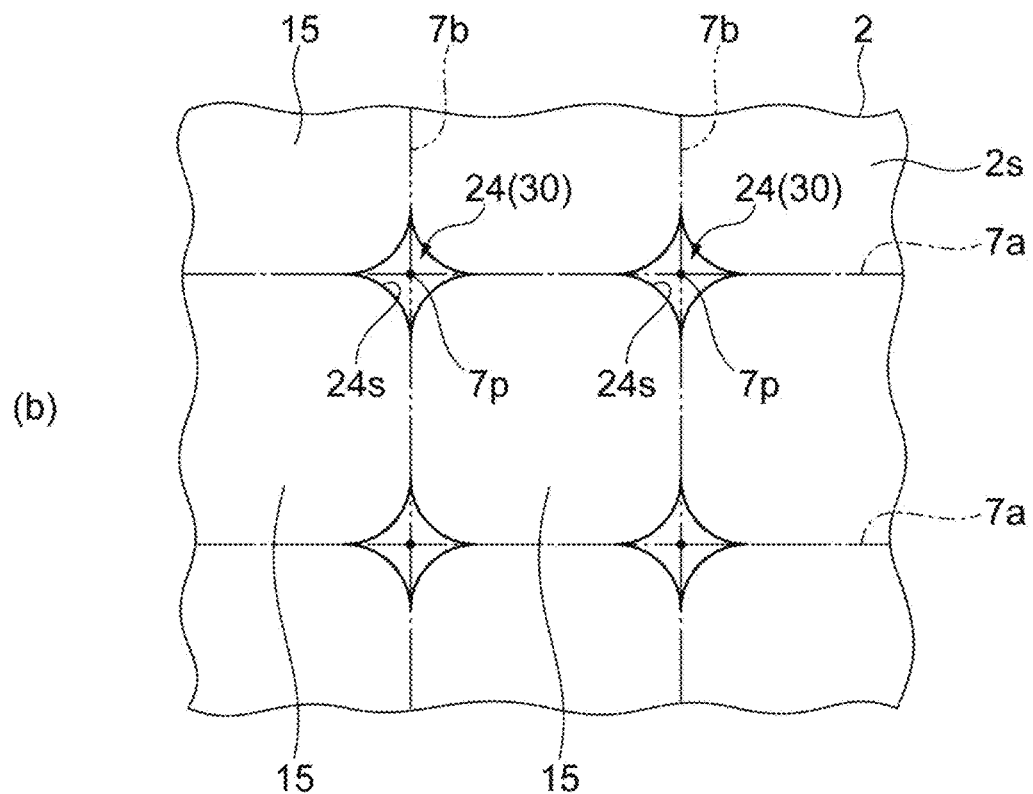
(b)

FORMING OPENINGS AT INTERSECTION OF CUTTING LINES

TECHNICAL FIELD

An aspect of the present invention relates to a chip production method and a silicon chip.

BACKGROUND ART

Patent Literature 1 discloses a semiconductor chip production method. In this method, a semiconductor wafer formed by stacking an n-type gallium nitride-based semiconductor layer (n-type layer) and a p-type gallium nitride-based semiconductor layer (p-type layer) on a sapphire substrate is divided into a plurality of semiconductor chips. In this method, first, element isolation grooves are formed according to desired chip shapes. The element isolation grooves are formed by etching the p-type layer. Subsequently, modified regions are formed inside the sapphire substrate. The modified regions are formed by performing irradiation of a laser light focused on a light condensing point inside the sapphire substrate. The modified regions are utilized for dividing the semiconductor wafer. After the modified regions are formed, the semiconductor wafer is cut into chips using a wafer breaking device.

CITATION LIST

Patent Literature

Patent Literature 1: Japanese Unexamined Patent Publication No. 2011-181909

SUMMARY OF INVENTION

Technical Problem

Incidentally, when chips are produced by such a method described above, lines forming a modified region through irradiation of a laser light define external shapes of chips. Therefore, when desired external shapes of chips are rectangular shapes, there is a need to form modified regions by performing irradiation of a laser light along lines extending in two directions intersecting each other. In this case, an intersection (position which becomes a corner of a chip) of lines in two directions is irradiated with a laser light at least twice. Therefore, at the intersection, there is concern that the modified region or the like formed through first irradiation of a laser light may adversely affect second irradiation of a laser light. As a result, there is concern that the quality of corners of chips after cutting may deteriorate.

An object of an aspect of the present invention is to provide a chip production method in which deterioration in quality can be curbed, and a silicon chip.

Solution to Problem

According to an aspect of the present invention, there is provided a chip production method including a first step of setting a first cutting line extending through a part between a plurality of functional elements and a second cutting line extending in a direction intersecting the first cutting line through a part between the functional elements on a substrate including the functional elements, a second step of forming a mask on the substrate such that the functional elements are covered and an intersection region including an intersection of the first cutting line and the second cutting line is exposed, a third step of removing the intersection region from the substrate and forming a penetration hole by etching the substrate using the mask, a fourth step of forming a modified region in the substrate along the first cutting line after the third step by relatively moving a light condensing point of a laser light along the first cutting line with respect to the substrate, a fifth step of forming a modified region in the substrate along the second cutting line after the third step by relatively moving a light condensing point of a laser light along the second cutting line with respect to the substrate, and a sixth step of forming chips corresponding to the functional elements after the fourth step and the fifth step by cutting the substrate along the first cutting line and the second cutting line.

In this production method, prior to formation of a modified region performed through irradiation of a laser light, the intersection region is removed from the substrate and the penetration hole is formed in the substrate by etching the substrate using a mask for exposing the intersection region including the intersection of the first cutting line and the second cutting line. Therefore, for example, when the fifth step is performed after the fourth step, a modified region does not adversely affect irradiation of a laser light (no modified region is present) at the intersection of the first cutting line and the second cutting line. Therefore, deterioration in quality of corners of chips can be curbed.

According to another aspect of the present invention, there is provided a chip production method including a first step of forming a mask which covers a plurality of functional elements and has an opening for defining corners of the functional elements on a substrate including the functional elements, a second step of forming a penetration hole corresponding to the opening on the substrate by etching the substrate using the mask, a third step of setting a first cutting line extending through a part between the functional elements and a second cutting line extending in a direction intersecting the first cutting line to intersect the first cutting line in the penetration hole through a part between the functional elements, a fourth step of forming a modified region in the substrate along the first cutting line after the third step by relatively moving a light condensing point of a laser light along the first cutting line with respect to the substrate, a fifth step of forming a modified region in the substrate along the second cutting line after the third step by relatively moving a light condensing point of a laser light along the second cutting line with respect to the substrate, and a sixth step of forming chips corresponding to the functional elements after the fourth step and the fifth step by cutting the substrate along the first cutting line and the second cutting line.

In this production method, prior to formation of a modified region performed through irradiation of a laser light, the penetration hole is formed in the substrate by performing etching using a mask having an opening for defining corners of the functional elements. Thereafter, the first cutting line and the second cutting line intersecting each other in the penetration hole are set. Therefore, for example, when the fifth step is performed after the fourth step, a modified region does not adversely affect irradiation of a laser light (no modified region is present) at the intersection of the first cutting line and the second cutting line. Therefore, deterioration in quality of corners of chips can be curbed.

Here, the inventor has ascertained the following knowledge while assiduously conducting investigation. That is, when the light condensing point of a laser light passes through the penetration hole while irradiation of a laser light remains on, although formation of a modified region necessary for cutting is not affected, there are cases where an inner surface of the penetration hole is damaged when the light condensing point of a laser light passes through the inner surface thereof. The inventor has completed the following invention based on this knowledge.

That is, in the chip production method according to the aspect of the present invention, in the fourth step and the fifth step, an output of the laser light may be decreased when the light condensing point reaches the penetration hole, and the output of the laser light may be increased when a position where the laser light is condensed has passed through the penetration hole after the output of the laser light is decreased. In this case, the light condensing point of a laser light can be prevented from passing through the inner surface of the penetration hole in a state where an output value of the laser light is relatively significant. Therefore, damage to the inner surface of the penetration hole is curbed, and deterioration in quality of corners of chips can be reliably curbed.

When an output of a laser light is decreased or increased, the output of a laser light can be decreased or increased with reference to a processing threshold at which a modified region can be formed. In this case, the output of a laser light is controlled such that it exceeds or falls below the processing threshold. Such control of an output of a laser light can be performed as follows, for example. That is, as an example, irradiation of a laser light can be turned on or off using a shutter. In this case, the output of a laser light (output when a substrate is irradiated) exceeds the processing threshold when irradiation is turned on and it becomes zero when irradiation is turned off. In addition, as another example, if a laser light source is a Q-switched laser, a Q-switch can be subjected to on/off control by controlling an RF output. In this case, even when the Q-switch is turned off, the output of a laser light does not become zero, and a substrate is irradiated with a laser light of a feeble output (below the processing threshold).

As still another example, a laser light can be switched between pulsed oscillation and continuous oscillation by controlling the laser light source. In this case, the output of a laser light can become larger than the processing threshold at the time of pulsed oscillation, and the output of a laser light can become smaller than the processing threshold at the time of continuous oscillation. Moreover, when a laser light is subjected to pulsed oscillation at all times, the laser light may be switched between a pulse exceeding the processing threshold and a pulse below the processing threshold by controlling the output strength of the pulsed oscillation. Furthermore, here, an arbitrary method for controlling an output of a laser light can be utilized.

The chip production method according to the aspect of the present invention may further include a seventh step of forming a metal film on an inner surface of the penetration hole after the third step and before the fourth step and the fifth step. Alternatively, the chip production method according to the aspect of the present invention may further include a seventh step of forming a metal film on an inner surface of the penetration hole after the second step and before the fourth step and the fifth step. In this case, it is possible to obtain chips in which metal films that can be utilized in electrodes or the like are formed in corners.

In the chip production method according to the aspect of the present invention, the intersection region may have a shape projecting toward a center of the intersection region. Alternatively, in the chip production method according to the aspect of the present invention, the opening may have a shape projecting toward a center of the opening. In this case, since corners of a chip have a chamfered shape by forming the penetration hole, the strength of chips is improved.

In the chip production method according to the aspect of the present invention, the etching may be dry etching. In this case, chips can be produced through a dry process.

According to another aspect of the present invention, there is provided a silicon chip including a plurality of corners that are chamfered, a plurality of side parts that connect the corners, and an outer surface. Polycrystal silicon is exposed in first areas corresponding to the side parts on the outer surface. Second areas corresponding to the corners on the outer surface are constituted of single crystal silicon to be flatter than the first areas. In this silicon chip, the corners are chamfered, and the second areas corresponding to the corners on the outer surface are constituted of single crystal silicon to be relatively flat. Therefore, the quality of the corners becomes favorable, and the silicon chip has a high strength. For example, such a silicon chip can be produced by the foregoing production method using a substrate including silicon. For example, comparison between the flatness of the second area and the flatness of the first area can be average comparison between the flatness (surface roughness) of the second area and the flatness (surface roughness) of the first area.

In the silicon chip according to the aspect of the present invention, in the first area, a region including the polycrystal silicon may be interposed between regions including the single crystal silicon in a thickness direction.

Advantageous Effects of Invention

According to the aspect of the present invention, it is possible to provide a chip production method in which deterioration in quality can be curbed, and a silicon chip.

BRIEF DESCRIPTION OF DRAWINGS

FIG. 9 is a view illustrating a step of forming a mask in the substrate.

FIG. 11 is a view illustrating a step related to laser processing.

FIG. 13 is a view illustrating a step of cutting a substrate and a produced chip.

FIG. 14 is a schematic view for describing operations and effects.

FIG. 15 is a plan view of a modification example.

DESCRIPTION OF EMBODIMENT

Hereinafter, an embodiment of an aspect of the present invention will be described in detail with reference to the drawings. In each diagram, the same reference signs are applied to parts which are the same or corresponding, and duplicate description will be omitted.

In a laser processing method and a laser processing apparatus according to the embodiment, a modified region is formed in a processing object along a cutting line by condensing a laser light on the processing object. First, formation of a modified region will be described with reference to FIGS. 1 to 6.

Figure 1:
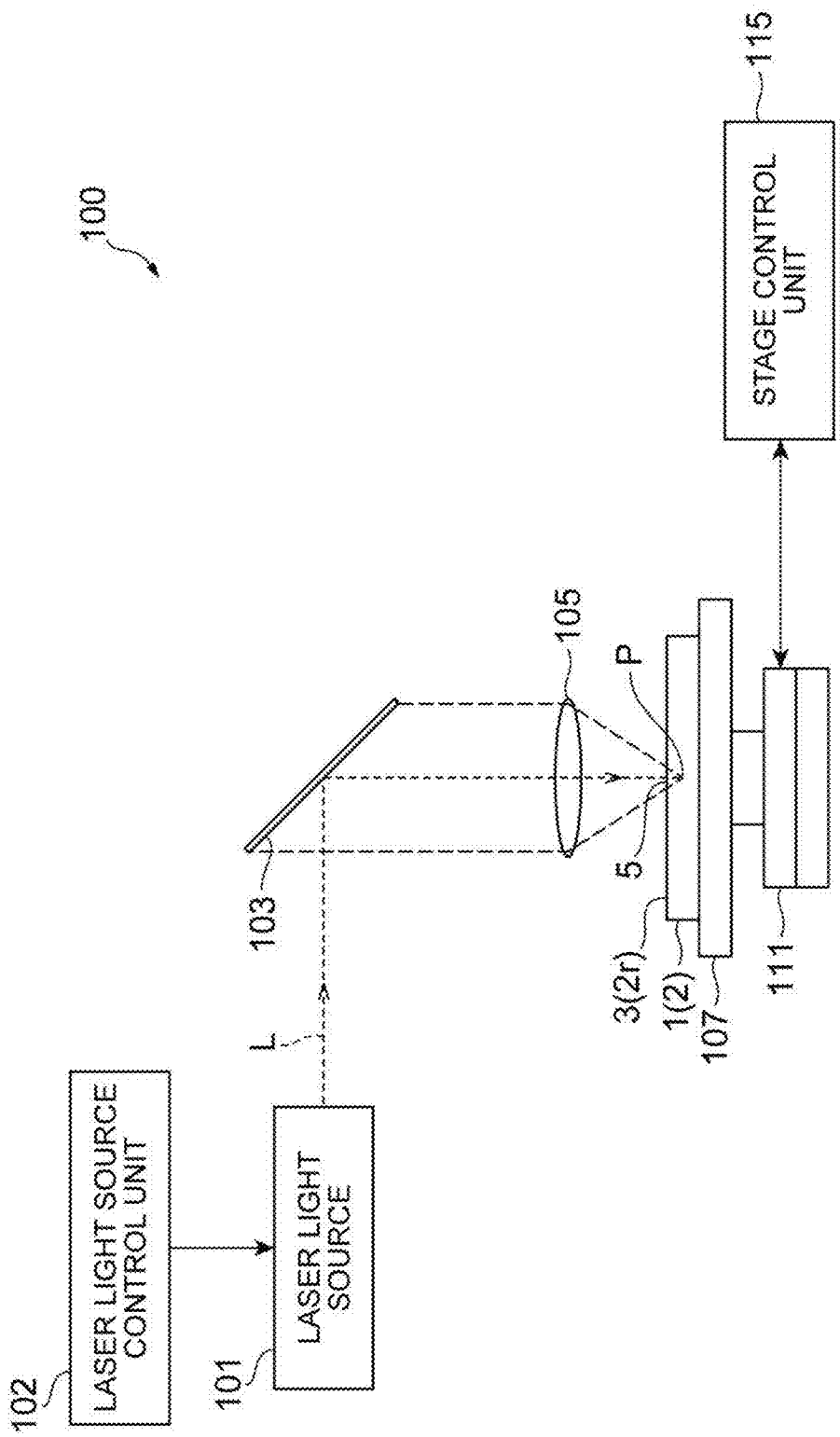
FIG. 1 is a schematic view of a constitution of a laser processing apparatus used for forming a modified region.

As illustrated in FIG. 1, a laser processing apparatus 100 includes a laser light source 101 that performs pulsed oscillation of a laser light L, a dichroic mirror 103 that is disposed to change the direction of an optical axis (optical path) of the laser light L by 90°, and a condensing lens 105 for condensing the laser light L. In addition, the laser processing apparatus 100 includes a support base 107 for supporting a processing object 1 irradiated with the laser light L condensed by the condensing lens 105, a stage 111 for moving the support base 107, a laser light source control unit 102 that controls the laser light source 101 such that an output of the laser light L, a pulse width, a pulse waveform and the like are adjusted, and a stage control unit 115 that controls movement of the stage 111.

In the laser processing apparatus 100, the dichroic mirror 103 changes the direction of the optical axis of the laser light L emitted from the laser light source 101 by 90°, and the laser light L is condensed by the condensing lens 105 inside the processing object 1 placed on the support base 107. At the same time, the stage 111 is moved, such that the processing object 1 is relatively moved along a cutting line 5 with respect to the laser light L. Accordingly, a modified region along the cutting line 5 is formed in the processing object 1. Here, the stage 111 is moved to relatively move the laser light L. However, the condensing lens 105 may be moved, or both may be moved.

Figure 2:
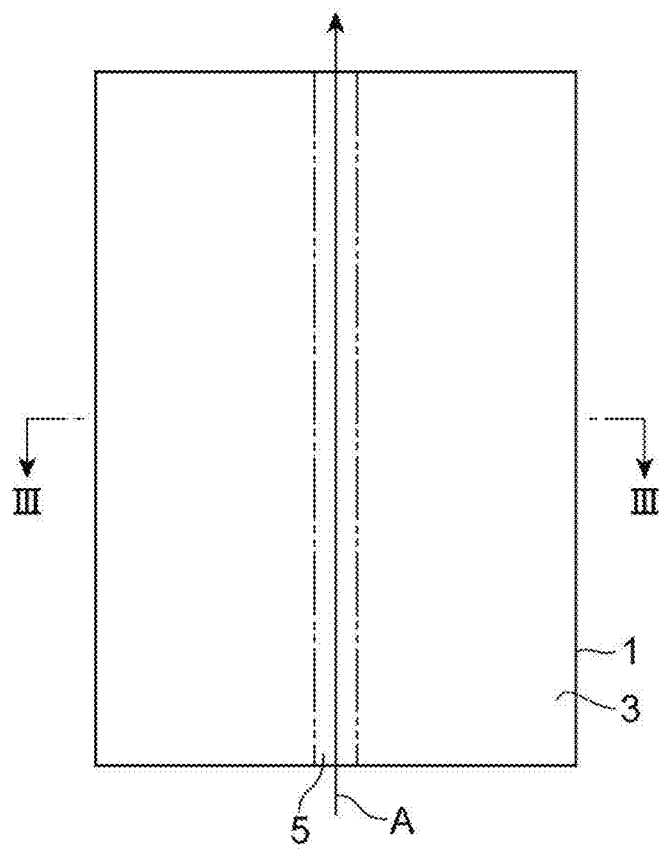
FIG. 2 is a plan view of a processing object which becomes a subject is which a modified region is formed.
Figure 3:
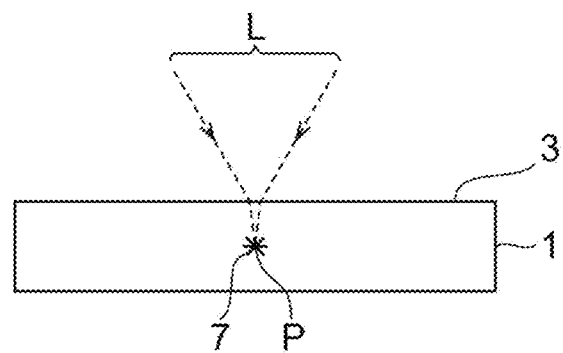
FIG. 3 is a cross-sectional view along line III-III of the processing object in FIG. 2.
Figure 4:
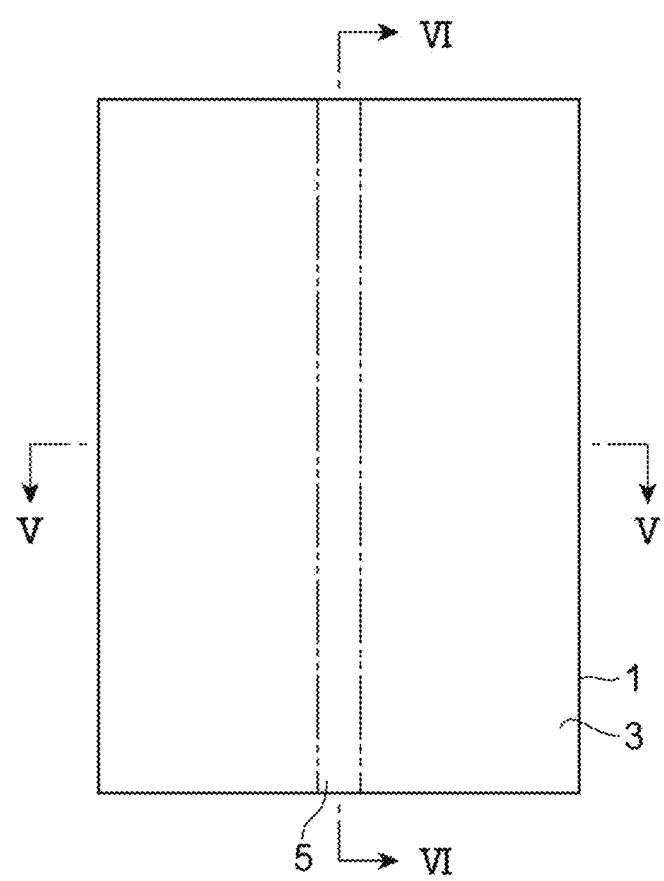
FIG. 4 is a plan view of a processing object after laser processing.
Figure 5:
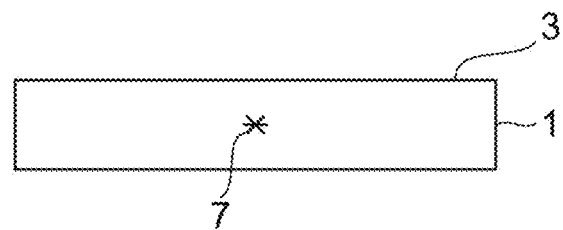
FIG. 5 is a cross-sectional view along line V-V of the processing object in FIG. 4.
Figure 6:
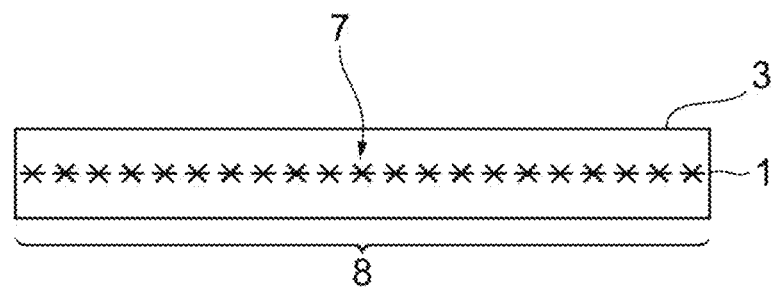
FIG. 6 is a cross-sectional view along line VI-VI of the processing object in FIG. 4.

Plate-like members (for example, substrates or wafers) including semiconductor substrates formed of a semiconductor material, piezoelectric substrates formed of a piezoelectric material, and the like are used as the processing object 1. As illustrated in FIG. 2, the cutting line 5 for cutting the processing object 1 is set in the processing object 1. The cutting line 5 is an imaginary line which extends linearly. When a modified region is formed inside the processing object 1, as illustrated in FIG. 3, the laser light L is relatively moved along the cutting line 5 (that is, in a direction of the arrow A in FIG. 2) in a state where a light condensing point (condensing position) P is focused inside the processing object 1. Accordingly, as illustrated in FIGS. 4, 5, and 6, a modified region 7 is formed in the processing object 1 along the cutting line 5, and the modified region 7 formed along the cutting line 5 becomes a cutting starting point region 8.

The light condensing point P indicates a place where the laser light L is condensed. The cutting line 5 is not limited to a linear shape. The cutting line 5 may have a curved shape or a three-dimensional shape in which these are combined, or may be subjected to coordinate designation. The cutting line 5 is not limited to an imaginary line and may be a line which is actually drawn on a surface 3 of the processing object 1. There are cases where the modified regions 7 are continuously formed or are intermittently formed. The modified regions 7 may be in an arrayed state or in a dotted state. The point is that the modified region 7 need only be formed at least inside the processing object 1. In addition, there are cases where cracking is formed with the modified region 7 as a starting point, and the cracking and the modified region 7 may be exposed on an outer surface (the surface 3, a rear surface, or an outer circumferential surface) of the processing object 1. A laser light incident surface when the modified region 7 is formed is not limited to the surface 3 of the processing object 1 and may be the rear surface of the processing object 1.

Incidentally, when the modified region 7 is formed inside the processing object 1, the laser light L is transmitted through the processing object 1 and is particularly absorbed in the vicinity of the light condensing point P positioned inside the processing object 1. Accordingly, the modified region 7 is formed in the processing object 1 (that is, internal absorption laser processing). In this case, since the laser light L is scarcely absorbed on the surface 3 of the processing object 1, the surface 3 of the processing object 1 does not melt. On the other hand, when the modified region 7 is formed on the surface 3 of the processing object 1, the laser light L is particularly absorbed in the vicinity of the light condensing point P positioned on the surface 3, so that the absorption part melts and is removed from the surface 3, and a removal portion such as a hole or a groove is formed (surface absorption laser processing).

The modified region 7 indicates a region in a state where the density, the refractive index, the mechanical strength, or other physical characteristics differ from the surrounding region. Examples of the modified region 7 include a molten processed region (which means at least any one of a region which has been resolidified after having melted temporarily, a region being in a molten state, and a region being resolidified from a molten state), a cracked region, an insulation breakdown region, a refractive index changing region, and a region in which these are mixed. Moreover, as the modified region 7, there are a region in which the density of the modified region 7 has changed compared to the density of a non-modified region regarding the material of the processing object 1, and a region in which a lattice defect is formed. When the material of the processing object 1 is single crystal silicon, the modified region 7 can be referred to as a high displacement density region.

There are cases where a molten processed region, a refractive index changing region, a region in which the density of the modified region 7 has changed compared to the density of a non-modified region, and a region in which a lattice defect is formed include cracking (a crack or a microcrack) inside the region thereof or on a boundary surface between the modified region 7 and a non-modified region. There are cases where the included cracking is formed throughout the whole surface of the modified region 7 or is formed in only a part or in a plurality of parts. The processing object 1 includes a substrate formed of a crystalline material having a crystal structure. For example, the processing object 1 includes a substrate formed of at least any of gallium nitride (GaN), silicon (Si), silicon carbide (SiC), $LiTaO_3$, and sapphire ($Al_2O_3$). In other words, for example, the processing object 1 includes a gallium nitride substrate, a silicon substrate, a SiC substrate, a $LiTaO_3$ substrate, and a sapphire substrate. The crystalline material may be either an anisotropic crystal or an isotropic crystal. In addition, the processing object 1 may include a substrate formed of a non-crystalline material having a non-crystal structure (amorphous structure) and may include a glass substrate, for example.

In the embodiment, the modified region 7 can be formed by forming a plurality of modified spots (processing indentations) along the cutting line 5. In this case, the plurality of modified spots collectively become the modified region 7. A modified spot indicates a modified part formed by a shot of one pulse of a pulsed laser light (that is, laser irradiation of one pulse: a laser shot). Examples of a modified spot include a crack spot, a molten processed spot, a refractive index changing spot, or a spot at which there is a mixture of at least one of these. Regarding a modified spot, the size thereof or the length of generated cracking can be appropriately controlled in consideration of required cutting accuracy, a required flatness on a cutting surface, and the thickness, the kind, the crystal orientation, and the like of the processing object 1. In addition, in the embodiment, a modified spot can be formed as the modified region 7 along the cutting line 5.

Figure 7:
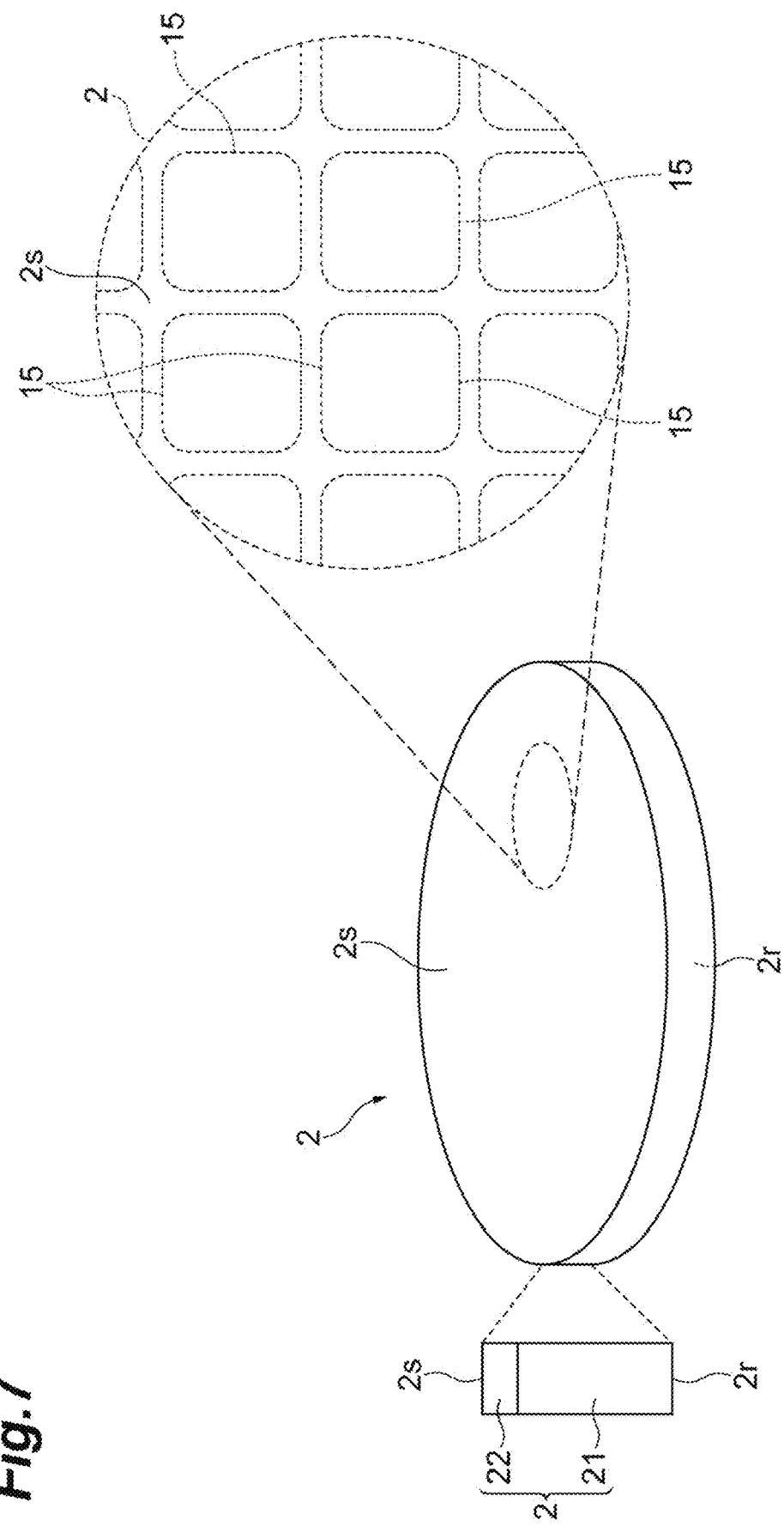
FIG. 7 is a view illustrating a substrate which is a processing object in a production method according to the present embodiment.
Figure 8:
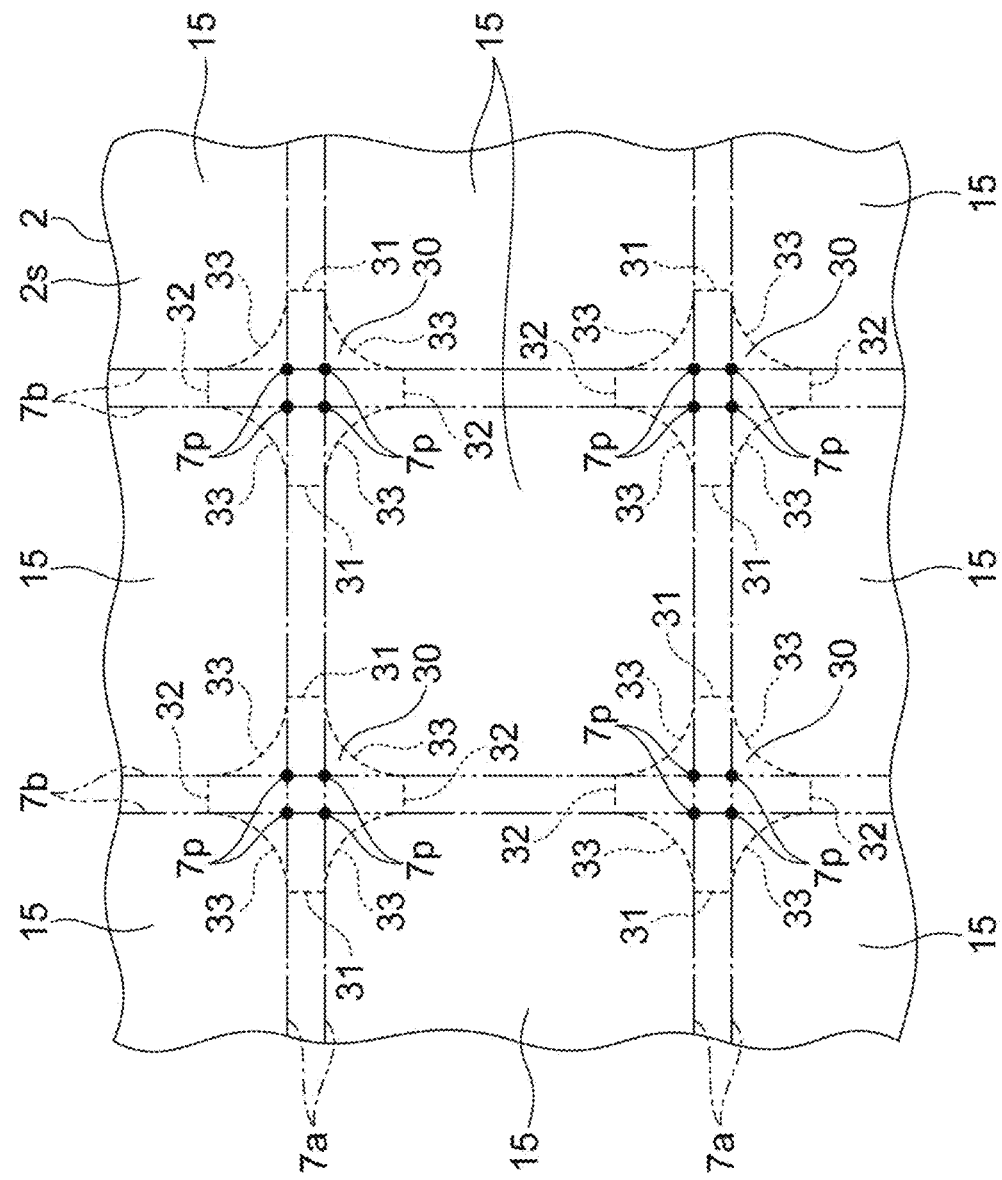
FIG. 8 is an enlarged plan view of a part of the substrate illustrated in FIG. 7.

Subsequently, an example of a chip production method according to the present embodiment will be described. Here, as an example, silicon chips are produced by utilizing the laser processing apparatus 100 and the laser processing method described above. FIG. 7 is a view illustrating a substrate which is a processing object in a production method according to the present embodiment. FIG. 8 is an enlarged plan view of a part of the substrate illustrated in FIG. 7. As illustrated in FIGS. 7 and 8, in this method, first, a substrate 2 (processing object 1) is prepared.

The substrate 2 contains silicon. More specifically, the substrate 2 includes a main surface 2s and a rear surface 2r. In addition, the substrate 2 includes a substrate layer 21 which contains silicon, and a device layer 22 which contains silicon and is formed on the substrate layer 21. The main surface 2s is a surface of the device layer 22 on a side opposite to the substrate layer 21. The rear surface 2r is a surface of the substrate layer 21 on a side opposite to the device layer 22. The main surface 2s and the rear surface 2r are directed to sides opposite to each other and are substantially parallel to each other.

For example, the substrate 2 has a plurality of functional elements 15 arranged in a two-dimensional matrix shape. For example, the functional elements 15 is a semiconductor operation layer formed through crystal growth, a light receiving element such as a photodiode, a light emitting element such as a laser diode, or a circuit element formed as a circuit. Silicon chips are produced by dicing the functional elements 15.

Subsequently, a plurality of first cutting lines 7a extending in a first direction through a part between the functional elements 15 are set (first step). The first direction is a direction along the main surface 2s. Here, a pair of first cutting lines 7a are set between a pair of functional elements 15 adjacent to each other in a second direction intersecting (orthogonal to) the first direction. In addition, a plurality of second cutting lines 7b extending in the second direction through a part between the functional elements 15 are set (first step). Here, a pair of second cutting lines 7b are set between a pair of functional elements 15 adjacent to each other in the first direction.

Accordingly, a plurality of intersections 7p of the first cutting lines 7a and the second cutting lines 7b are formed in the substrate 2 (main surface 2s). Here, four intersections 7p are formed in a region where a plurality of corners of four functional elements 15 are integrated. That is, a plurality of intersection regions 30 including a plurality (here, four) of intersections 7p are defined in the substrate 2. Each of the intersection regions 30 includes a pair of first straight portions 31 extending in the second direction between the pair of first cutting lines 7a, and a pair of second straight portions 32 extending in the first direction between the pair of second cutting lines 7b, when viewed in a direction intersecting the main surface 2s.

In addition, each of the intersection regions 30 includes four curved portions 33 which extend to connect a pair of the first cutting line 7a and the second cutting line 7b defining one functional element 15 to each other, when viewed in a direction intersecting the main surface 2s. The first straight portion 31, the second straight portion 32, and the curved portion 33 are connected to each other and form a single closed curve (flat surface shape of an intersection region 30). Here, the curved portion 33 is curved to project (for example, in an arc shape) toward the center of the intersection region 30. The curved portion 33 defines a corner of a silicon chip. Therefore, corners of produced silicon chips are chamfered in accordance with curves of the curved portions 33.

Subsequently, as illustrated in FIG. 9, a mask M is formed in the substrate 2 (second step). The mask M is formed of a material (for example, a photoresist) resistant to etching in the following step. An opening Mp is formed in the mask M. The opening Mp corresponds to the intersection region 30. Therefore, here, the mask M is formed on the main surface 2s of the substrate 2 such that the functional elements 15 are covered and the intersection regions 30 are exposed. The opening Mp defines corners of the functional elements 15. The opening Mp has a shape projecting toward the center of the opening Mp. FIG. 9(a) is a plan view, and FIG. 9(b) is a cross-sectional view along line b-b in FIG. 9(a).

Figure 10:
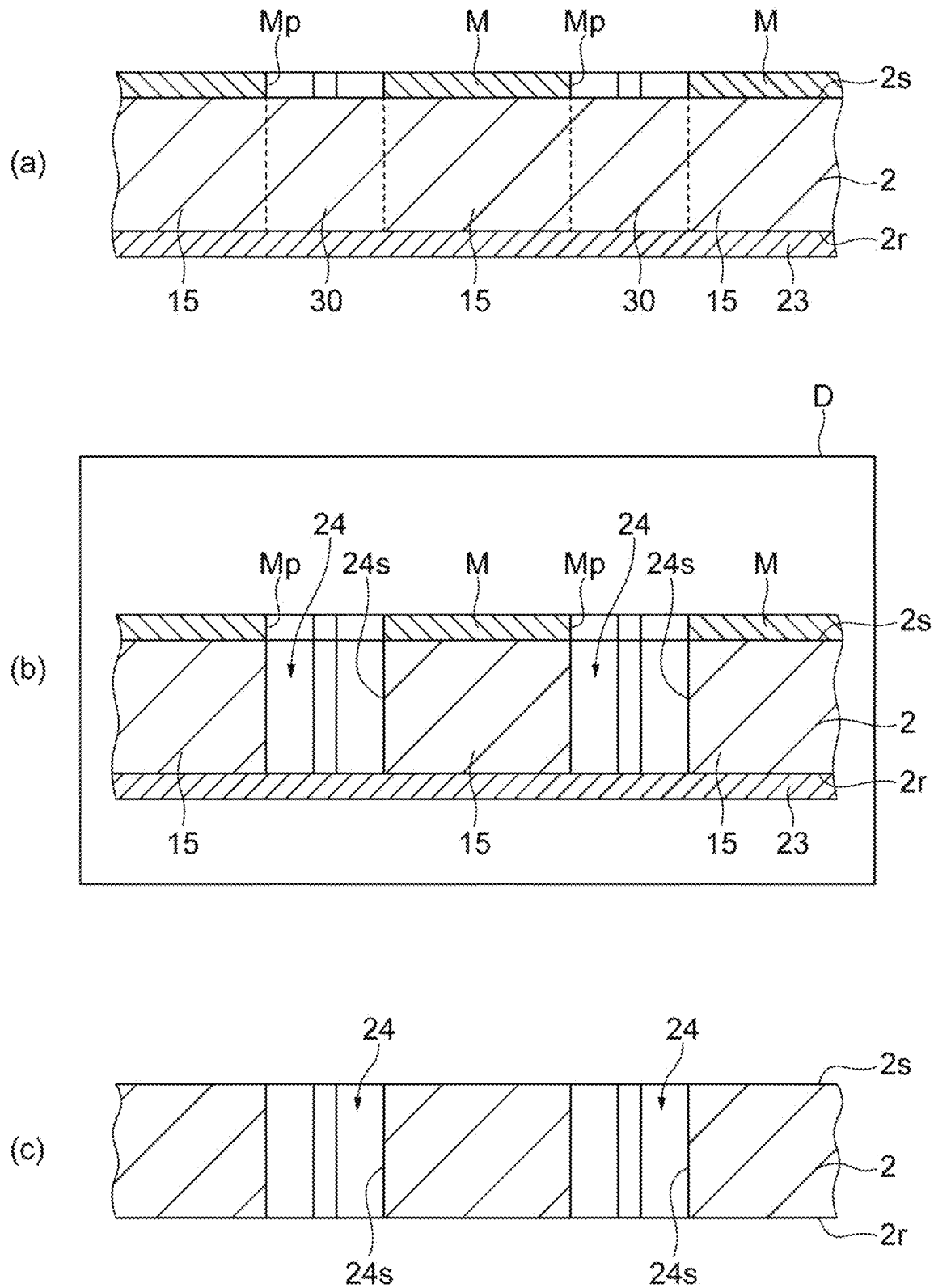
FIG. 10 is a view illustrating a step of etching the substrate using the mask.

Subsequently, the intersection regions 30 are removed from the substrate 2 and penetration holes are formed by etching the substrate 2 using the mask M (third step). More specifically, first, as illustrated in FIG. 10(a), a protective layer 23 (a tape, an inorganic film, or an organic film) is provided on the rear surface 2r of the substrate 2. Subsequently, as illustrated in FIG. 10(b), the substrate 2 is disposed in an etching device D, and the substrate 2 is etched using the mask M. Here, for example, dry etching is performed. As an example, the etching in this case can be reactive ion etching (RIE or DRIE) using $SF_6$ as an etching gas.

Accordingly, the intersection regions 30 exposed through the mask M are removed from the substrate 2 and a plurality of penetration holes 24 are formed in the substrate 2. Thereafter, as illustrated in FIG. 10(c), the substrate 2 is taken out from the etching device D, and the protective layer 23 is removed from the rear surface 2r. In addition, the mask M is removed. Thereafter, the procedure proceeds to laser processing of the substrate 2.

That is, in the following step, as illustrated in FIG. 1, the substrate 2 is placed on the support base 107 of the laser processing apparatus 100. Here, the substrate 2 is placed on the support base 107 such that the rear surface 2r of the substrate 2 is positioned on the condensing lens 105 side. Therefore, here, the rear surface 2r of the substrate 2 becomes the laser light incident surface. As illustrated in FIG. 11(b), a protective film 25 is provided on the main surface 2s of the substrate 2.

Subsequently, as illustrated in FIG. 11, in a state where the light condensing point P of the laser light L is positioned inside the substrate 2, the modified region 7 is formed in the substrate 2 along the first cutting line 7a by relatively moving the light condensing point P along the first cutting line 7a with respect to the substrate 2 (fourth step). Here, as an example, the light condensing point P is relatively moved with respect to the substrate 2 by moving the stage 111 while fixing the positions of the light condensing point P and the condensing lens 105.

Figure 12:
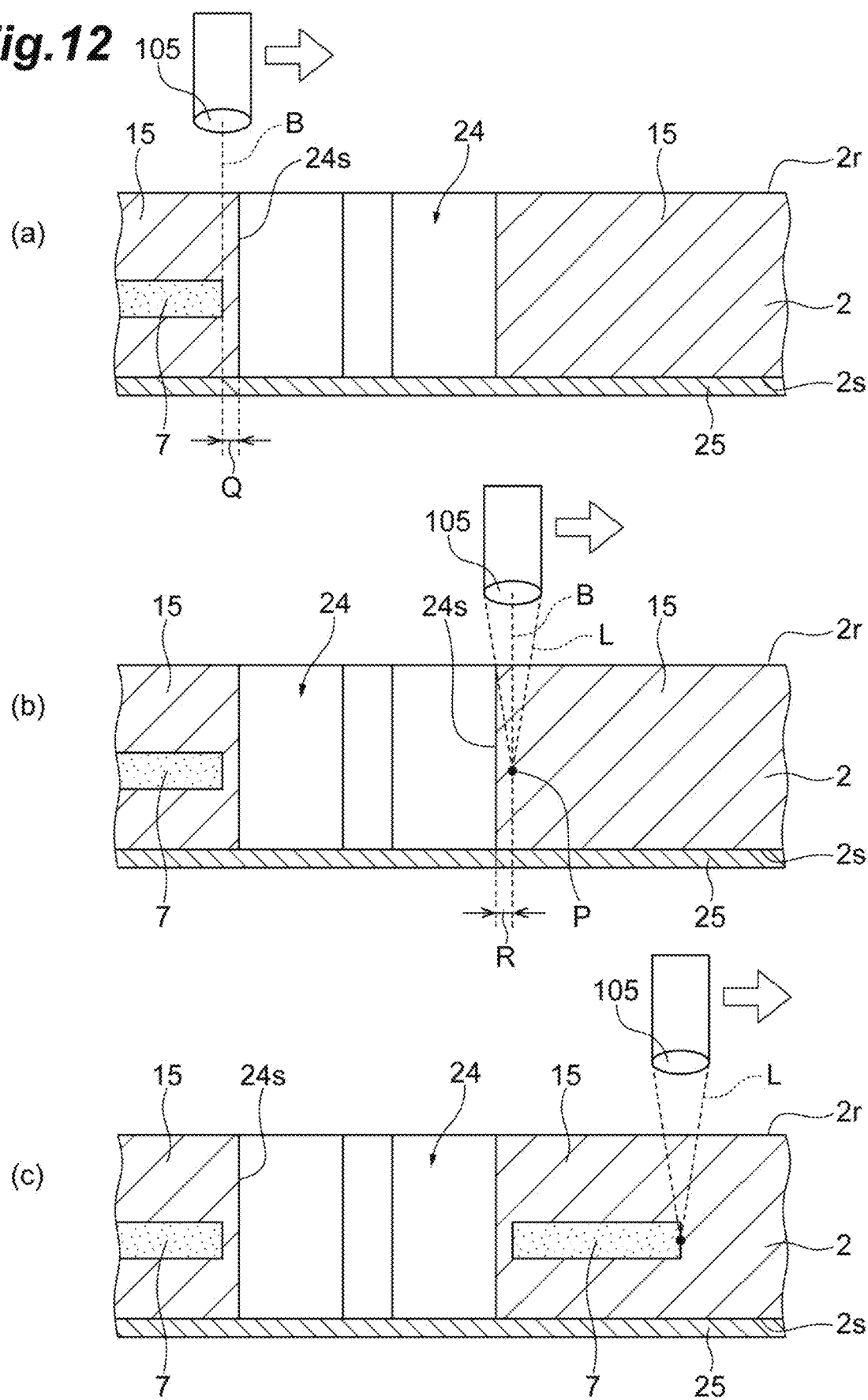
FIG. 12 is a view illustrating the step related to laser processing.

At this time, as illustrated in FIG. 12(a), the output of the laser light L is decreased when the light condensing point P reaches the penetration hole 24 (here, irradiation is turned off). The time when the light condensing point P reaches the penetration hole 24 indicates a time immediately before the light condensing point P (here, an optical axis B of the condensing lens 105) reaches the penetration hole 24, that is, when it reaches a position at a predetermined distance Q in front of an inner surface 24s of the penetration hole 24. The predetermined distance Q is approximately 10 μm, for example. Accordingly, the light condensing point P (laser light L) does not pass through the inner surface 24s when reaching the inside of the penetration hole 24 from the inside of the substrate 2.

On the other hand, as illustrated in FIG. 12(b), when the position where the laser light L is condensed has passed through the penetration hole 24 after the output of the laser light L is decreased (irradiation is turned off), the output of the laser light L is increased (here, irradiation is turned on again). The position where the laser light L is condensed is a position where the light condensing point P is formed when irradiation of the laser light L is turned on (for example, the position of the optical axis B of the condensing lens 105. In addition, the time when the position where the laser light L is condensed has passed through the penetration hole 24 indicates a time when the position where the laser light L is condensed reaches an inner portion side of the substrate 2 at a predetermined distance R from the inner surface 24s of the penetration hole 24.

For example, the predetermined distance R may be the same as the predetermined distance Q and is approximately 10 μm, as an example. Accordingly, the light condensing point P (laser light L) does not pass through the inner surface 24s when reaching the inside of the substrate 2 from the inside of the penetration hole 24. Thereafter, as illustrated in FIG. 12(c), formation of the modified region 7 proceeds by relatively moving the light condensing point P. The modified region 7 is formed similarly with respect to all of the first cutting lines 7a.

Similarly, although it is not illustrated, in a state where the light condensing point P of the laser light L is positioned inside the substrate 2, the modified regions 7 are formed in the substrate 2 along all of the second cutting lines 7b by relatively moving the light condensing point P along the second cutting lines 7b with respect to the substrate 2 (fifth step). Accordingly, the modified regions 7 are formed at least inside the substrate 2 along all of the first cutting lines 7a and all of the second cutting lines 7b.

Thereafter, as illustrated in FIG. 13(a), for example, the substrate 2 is cut along the first cutting lines 7a and the second cutting lines 7b with the modified region 7 (and cracking extending from the modified region 7) as a starting point by expanding an expand tape 26 provided on the rear surface 2r of the substrate 2 (sixth step). Accordingly, as illustrated in FIG. 13(b), the functional elements 15 is diced, and silicon chips 16 corresponding to the functional elements 15 are produced.

The external shapes of the produced silicon chips 16 are defined by the first cutting lines 7a, the second cutting lines 7b, and the external shapes (inner surfaces 24s of the penetration holes 24) of the intersection regions 30. Here, the external shape of the silicon chip 16 is a rectangular shape. Therefore, the silicon chip 16 includes a plurality of corners 16c (four corners 16c) and a plurality of side parts 16d (four side parts 16d) connecting the corners 16c to each other. In addition, the silicon chip 16 includes a main surface 16s corresponding the main surface 2s of the substrate 2, a rear surface 16r corresponding the rear surface 2r of the substrate 2, and a rectangularly annular outer surface 16t connecting the main surface 16s and the rear surface 16r to each other.

The outer surface 16t includes first areas Ad corresponding to the side parts 16d and second areas Ac corresponding to the corners 16c. The corners 16c are defined by the flat surface shapes (inner surfaces 24s of the penetration holes 24) of the intersection regions 30 and are chamfered to project (for example, in an arc shape) outward from the silicon chip 16. Therefore, the second area Ac has a curved surface shape (partially cylindrical surface shape). On the other hand, the first area Ad is defined by the first cutting line 7a or the second cutting line 7b and has a flat surface shape.

Single crystal silicon and polycrystal silicon (modified region 7) are exposed in the first area Ad in a mixed manner. More specifically, the first area Ad includes the modified region 7 which is a region containing polycrystal silicon, and non-modified regions N which are regions containing single crystal silicon (formed of single crystal silicon). Then, the modified region 7 is interposed between the non-modified regions N in a thickness direction of the silicon chip 16. A plurality of modified regions 7 may be interposed between the non-modified regions N. The second area Ac does not include the modified region 7 and is constituted of single crystal silicon (etched region formed through etching). Therefore, the second area Ac is flatter than the first area Ad. For example, comparison between the flatness of the second area Ac and the flatness of the first area Ad can be average comparison between the flatness (surface roughness) of the second area Ac and the flatness (surface roughness) of the first area Ad.

Subsequently, operations and effects of the chip production method according to the present embodiment will be described with reference to FIG. 14. In FIG. 14(a), in order to facilitate the description, the penetration hole 24 has a cylindrical shape, and the first cutting line 7a and the second cutting line 7b are illustrated one each. In the method according to the present embodiment, prior to formation of the modified region 7 performed through irradiation of the laser light L, the intersection region 30 is removed from the substrate 2 and the penetration hole 24 is formed in the substrate 2 by etching the substrate using the mask M for exposing the intersection region 30 including the intersection of the first cutting line 7a and the second cutting line 7b.

Therefore, when the fourth step and the fifth step (step of forming the modified region 7) are performed, a region (intersection region 30) in the vicinity of the intersection 7p of the first cutting line 7a and the second cutting line 7b in the substrate 2 is not present. Therefore, for example, when the fifth step is performed after the fourth step, the modified region 7 does not adversely affect irradiation of the laser light L (no modified region 7 is present) at the intersection 7p of the first cutting line 7a and the second cutting line 7b. Therefore, deterioration in quality of the silicon chips 16 can be curbed.

In addition, in this production method, in the fourth step and the fifth step, irradiation of the laser light L is turned off when the light condensing point P reaches the penetration hole 24, and irradiation of the laser light L is turned on when the position where the laser light L is condensed (for example, the optical axis B of the condensing lens 105) has passed through the penetration hole 24 after irradiation of the laser light L is turned off. Therefore, the light condensing point P of the laser light L can be prevented from passing through the inner surface 24s (edge part) of the penetration hole 24. Therefore, damage to the inner surface 24s of the penetration hole 24 is curbed, and deterioration in quality of the corners 16c of the silicon chips 16 can be reliably curbed.

When the modified region 7 adversely affects irradiation of the laser light L at the intersection 7p, there is concern that there may be an uncut chip in the vicinity of a predetermined intersection 7p. However, according to the production method, such a problem can also be resolved.

In addition, in this production method, the intersection region 30 has a shape projecting toward the center of the intersection region 30 when viewed in a direction intersecting the main surface 2s. Therefore, since the corners 16c of the silicon chip 16 have a chamfered shape by removing the intersection region 30, the strength of the silicon chips 16 is improved.

Moreover, in this production method, etching is dry etching. Therefore, the silicon chips 16 can be produced through a dry process including laser processing.

In the silicon chip 16, the corners 16c are chamfered, and the second areas Ac corresponding to the corners 16c of the outer surface 16t are constituted of single crystal silicon to be relatively flat. Therefore, the quality of the corners 16c becomes favorable, and the silicon chip has a high strength. However, as illustrated in FIG. 14(b), when etching is performed through a Bosch process of DRIB, minute unevenness is generated. The size of this unevenness is smaller than the size of unevenness in the modified region 7. As an example, unevenness in the second area Ac is approximately 1 μm, and unevenness in the modified region 7 is approximately 4 μm. Therefore, in this case as well, the second area Ac is flatter than the first area Ad.

The method and the chip described above describe the embodiment of the chip production method and the silicon chip according to the aspect of the present invention. Therefore, the chip production method and the silicon chip according to the aspect of the present invention are not limited to the foregoing method and the foregoing chip. In the aspect of the present invention, the method and the chip can be arbitrarily changed within a range in which the gist of each of the claims is not changed.

For example, as illustrated in FIG. 15(a), the shapes of the penetration hole 24 and the intersection region 30 may be a cylindrical shape (circular shape when viewed in a direction intersecting the main surface 2s). As illustrated in FIG. 15(b), the shapes of the penetration hole 24 and the intersection region 30 may be constituted of a plurality (four) of cylindrical surfaces projecting toward the center.

Moreover, the foregoing production method may further include a seventh step of forming a metal film (for example, performing vapor deposition) on the inner surface 24s of the penetration hole 24 after the third step and before the fourth step and the fifth step. In this case, it is possible to obtain the silicon chips 16 in which metal films that can be utilized in electrodes or the like are formed in the corners 16c.

Here, in the foregoing embodiment, the penetration holes 24 are formed by forming and etching the mask M after the first cutting lines 7a and the second cutting lines 7b are set. However, the steps may be reversed. That is, first, as the first step, the functional elements 15 is covered and the mask M having the opening Mp for defining corners of the functional elements 15 is formed on the substrate 2 including a plurality of functional elements 15. Subsequently, as the second step, the penetration hole 24 corresponding to the opening Mp is formed in the substrate 2 by etching the substrate 2 using the mask M. Thereafter, as the third step, the first cutting line 7a extending through a part between the functional elements 15, and the second cutting line 7b extending in a direction intersecting the first cutting line 7a to intersect the first cutting line 7a in the penetration hole 24 through a part between the functional elements 15 are set. The same applies to the fourth to sixth steps performed thereafter. In this case as well, the same effects as those described above can be exhibited. However, in this case, the seventh step of forming a metal film on the inner surface 24s of the penetration hole 24 can be performed after the second step and before the fourth step and the fifth step.

In addition, in the foregoing embodiment, a case where in the fourth step and the fifth step, irradiation of the laser light L is turned off when the light condensing point P reaches the penetration hole 24, and irradiation of the laser light L is turned on again when the position where the laser light L is condensed has passed through the penetration hole 24 after irradiation of the laser light L is turned off has been described as an example. However, in the fourth step and the fifth step, such control of the laser light L does not have to be performed. In a case where such control of the laser light L is performed, the output of the laser light L may be decreased when the light condensing point P reaches the penetration hole 24, and the output of the laser light L is increased (returns to the original state) when the position where the laser light L is condensed has passed through the penetration hole 24 after the output of the laser light L is decreased.

When the output of the laser light L is decreased or increased, the output of the laser light L can be decreased or increased with reference to a processing threshold at which the modified region 7 can be formed. In this case, the output of the laser light L is controlled such that it exceeds or falls below the processing threshold. Such control of the output of the laser light L can be performed as follows, for example. That is, as an example, irradiation of the laser light L can be turned on or off using a shutter (for example, in the case of the foregoing embodiment). In this case, the output of the laser light L (output when the substrate 2 is irradiated) exceeds the processing threshold when irradiation is turned on and it becomes zero when irradiation is turned off.

In addition, as another example, if the laser light source 101 is a Q-switched laser, a Q-switch can be subjected to on/off control by controlling an RF output. In this case, even when the Q-switch is turned off, the output of the laser light L does not become zero, and the substrate 2 is irradiated with the laser light L of a feeble output (below the processing threshold).

As still another example, the laser light L can be switched between pulsed oscillation and continuous oscillation by controlling the laser light source 101. In this case, the output of the laser light L can become larger than the processing threshold at the time of pulsed oscillation, and the output of the laser light L can become smaller than the processing threshold at the time of continuous oscillation. Moreover, when the laser light L is subjected to pulsed oscillation at all times, the laser light L may be switched between a pulse exceeding the processing threshold and a pulse below the processing threshold by controlling the output strength of the pulsed oscillation. Furthermore, here, an arbitrary method for controlling the output of the laser light L can be utilized.

In the foregoing embodiment, a case where dry etching is adopted for etching has been described as an example. However, etching may be wet etching.

INDUSTRIAL APPLICABILITY

There is provided a chip production method in which deterioration in quality can be curbed, and a silicon chip.

REFERENCE SIGNS LIST

2 Substrate
7 Modified region
7a First cutting line
7b Second cutting line
7p Intersection
15 Functional element
16 Silicon chip (chip)
16c Corner
16d Side part
16t Outer surface
24 Penetration hole
24s Inner surface
30 Intersection region
Ac Second area
Ad First area
L Laser light
M Mask
Mp Opening
P Light condensing point

The invention claimed is:

1. A chip production method comprising:
a first step of forming a mask which covers a plurality of functional elements and has an opening for defining corners of the functional elements on a substrate including the functional elements;
a second step of forming a penetration hole corresponding to the opening on the substrate by etching the substrate using the mask;
a third step of setting a first cutting line extending through a part between the functional elements and a second cutting line extending in a direction intersecting the first cutting line to intersect the first cutting line in the penetration hole through a part between the functional elements;
a fourth step of forming a modified region in the substrate along the first cutting line after the third step by relatively moving a light condensing point of a laser light along the first cutting line with respect to the substrate;
a fifth step of forming a modified region in the substrate along the second cutting line after the third step by relatively moving a light condensing point of a laser light along the second cutting line with respect to the substrate; and
a sixth step of forming chips corresponding to the functional elements after the fourth step and the fifth step by cutting the substrate along the first cutting line and the second cutting line,
wherein in the fourth step and the fifth step, an output of the laser light is decreased so as to be lower than a processing threshold when the light condensing point reaches the penetration hole and reaches a position at a first predetermined distance in front of an inner surface of the penetration hole, and the output of the laser light is increased so as to exceed the processing threshold when a position where the laser light is condensed has passed through the penetration hole after the output of the laser light is decreased and when the position reaches an inner side of the substrate at a second predetermined distance from the inner surface of the penetration hole.

2. The chip production method according to claim 1, wherein the opening has a shape projecting toward a center of the opening.

3. The chip production method according to claim 1, wherein the etching is dry etching.

4. A chip production method comprising:
a first step of forming a mask which covers a plurality of functional elements and has an opening for defining corners of the functional elements on a substrate including the functional elements;
a second step of forming a penetration hole corresponding to the opening on the substrate by etching the substrate using the mask;
a third step of setting a first cutting line extending through a part between the functional elements and a second cutting line extending in a direction intersecting the first cutting line to intersect the first cutting line in the penetration hole through a part between the functional elements;
a fourth step of forming a modified region in the substrate along the first cutting line after the third step by relatively moving a light condensing point of a laser light along the first cutting line with respect to the substrate;
a fifth step of forming a modified region in the substrate along the second cutting line after the third step by relatively moving a light condensing point of a laser light along the second cutting line with respect to the substrate;
a sixth step of forming chips corresponding to the functional elements after the fourth step and the fifth step by cutting the substrate along the first cutting line and the second cutting line; and
a seventh step of forming a metal film on an inner surface of the penetration hole after the second step and before the fourth step and the fifth step.

* * * * *